United States Patent [19]

Herz et al.

[11] Patent Number: 4,547,394
[45] Date of Patent: Oct. 15, 1985

[54] USE OF HYDROXYALKYLPHENONES AS INITIATORS FOR RADIATION CURING OF AQUEOUS PREPOLYMER DISPERSIONS

[75] Inventors: Claus P. Herz, Heidelberg; Jörg Ohngemach, Reinheim; Otto Stahlecker, Darmstadt, all of Fed. Rep. of Germany

[73] Assignee: Merck Patent Gesellschaft mit beschrankter Haftung, Darmstadt, Fed. Rep. of Germany

[21] Appl. No.: 461,906

[22] Filed: Jan. 28, 1983

[30] Foreign Application Priority Data

Jan. 30, 1982 [DE] Fed. Rep. of Germany ....... 3203096

[51] Int. Cl.$^4$ .............................................. C08F 2/50
[52] U.S. Cl. ............................. 427/54.1; 204/159.18; 204/159.23; 204/159.24
[58] Field of Search ..................... 204/159.18, 159.23, 204/159.24; 427/54.1

[56] References Cited

U.S. PATENT DOCUMENTS

| | | |
|---|---|---|
| 2,892,865 | 6/1959 | Giraldi et al. . |
| 3,330,659 | 7/1967 | Wainer . |
| 3,660,542 | 5/1972 | Adachi et al. . |
| 3,801,329 | 4/1974 | Sandner et al. . |
| 3,933,682 | 1/1976 | Bean . |
| 3,965,157 | 6/1976 | Harrison . |
| 4,017,652 | 4/1977 | Gruber . |
| 4,054,719 | 10/1977 | Cordes, III . |
| 4,071,424 | 1/1978 | Dart et al. . |
| 4,125,503 | 11/1978 | McCarty et al. ............... 204/159.16 |
| 4,284,485 | 8/1981 | Berner . |
| 4,287,039 | 9/1981 | Buethe et al. ................... 204/159.19 |
| 4,308,400 | 12/1981 | Felder et al. . |
| 4,315,807 | 2/1982 | Felder et al. . |
| 4,318,791 | 3/1982 | Felder et al. . |
| 4,321,118 | 3/1982 | Felder et al. . |
| 4,339,566 | 7/1982 | Rosenkranz et al. .......... 204/159.22 |
| 4,347,111 | 8/1982 | Gehlhaus et al. ............... 204/159.16 |
| 4,374,984 | 2/1983 | Eichler et al. ..................... 544/121 |

FOREIGN PATENT DOCUMENTS

| | | |
|---|---|---|
| 33896 | 8/1981 | European Pat. Off. . |
| 2432563 | 2/1975 | Fed. Rep. of Germany . |
| 2343362 | 8/1979 | Fed. Rep. of Germany . |
| 2156486 | 6/1973 | France . |

OTHER PUBLICATIONS

Bull. Soc. Chim. France 1967, 1047–1052.
J. Gen. Chem. (USSR) 30, 792–795 (1960).
J. Med. Chem. 7, 178–186 (1964).
J. Amer. Chem. Soc. 75, 5975–5978 (1953).
Biochem. Zeitschrift 192, 220–228.
Synthesis 1975, 391–392.
Tetrahedron Letters 1974, 4319.
Bull. Soc. Chem. France 1970, 3715–3720.
J. Amer. Chem. Soc. 100 1962 (1978); Antedated by Priority.

Primary Examiner—Wilbert J. Briggs, Sr.
Assistant Examiner—A. H. Koeckert
Attorney, Agent, or Firm—Millen & White

[57] ABSTRACT

Hydroxyalkylphenones of formula I

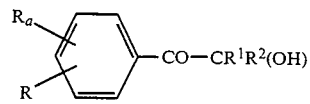

wherein R is hydrogen, halogen, alkyl of 1 to 18 C atoms, alkoxy of 1 to 4 C atoms or

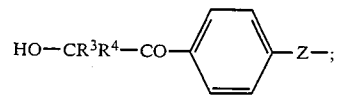

$R_a$ is hydrogen, halogen or alkyl of 1 to 4 C atoms; $R^1$ and $R^2$ (a) are each alkyl of up to 14, together 4 to 16, C atoms or together are alkylene of 4 to 8 C atoms, if R is hydrogen, halogen, alkyl of 1 to 6 C atoms or alkoxy of 1 to 4 C atoms, or (b) are each alkyl of 1 to 6 C atoms or together are alkylene of 2 to 8 C atoms, if R is alkyl of 3 to 18 C atoms or

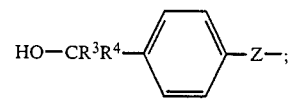

$R^3$ and $R^4$ are each alkyl of 1 to 6 C atoms or together are alkylene of 2 to 8 C atoms and Z is —CO—, —CH$_2$—, —O— or —S—; are suitable as initiators for radiation curing aqueous prepolymer dispersions. They have good stability in aqueous systems and also upon removal of the water from these systems, and they have a considerably increased reactivity in their ability to initiate the curing of aqueous systems curable by radiation.

20 Claims, No Drawings

USE OF HYDROXYALKYLPHENONES AS INITIATORS FOR RADIATION CURING OF AQUEOUS PREPOLYMER DISPERSIONS

BACKGROUND OF THE INVENTION

The present invention relates to the use of hydroxyalkylphenones as initiators for radiation curing of aqueous prepolymer dispersions.

Photochemically initiated polymerization reactions have attained great importance in industry, especially when the object is rapid curing of thin layers, such as, for example, in the curing of varnish and resin coatings on paper, metal and plastic. In this context, radiation curing in the presence of photoinitiators is distinguished, as compared to conventional methods for curing coatings, by savings in raw materials and energy, low thermal stress on the substrate and, in particular, a high rate of curing. In addition, more recently, interest has increased in aqueous systems free of volatile components as environmentally acceptable coating agents, especially because, using these, pollution of the environment by organic solvents and monomers can be avoided or at least reduced; the danger of fire when handling coating, impregnating and adhesives formulations can be reduced; and the high costs of organic solvents can be saved.

However, aqueous coating agents of this type make particular demands on the photoinitiator used. Particularly relevant are the solubility of the initiator in the reaction mixture, the stability on storage in the dark of the reaction system to which the initiator has been added, the chemical stability of the initiator in aqueous systems and its behavior when the water is removed from these aqueous systems and, above all, on its reactivity, which determines the rate of curing.

Photoinitiators which are suitable for use in aqueous prepolymer dispersions curable by radiation and which have hitherto been mentioned are mainly benzophenone derivatives, benzoin ethers, benzil monoketals, anthraquinones, thioxanthones and their derivatives and other aromatic ketones. However, a number of disadvantages are associated with these photoinitiators. These include, inter alia, insufficient stability of the systems curable by radiation to which these initiators have been added and yellowing of the cured polymers due to residues of the initiator or decomposition products arising therefrom during the photochemical reaction. In particular, however, these photoinitiators have an inadequate reactivity in the radiation curing of these special systems, and this makes relatively long curing times necessary.

Moreover, 1-phenyl-2-hydroxy-2-methyl-1-propanone, belonging to the group of hydroxyalkylphenones, has already been recommended as a photoinitiator for special aqueous prepolymer systems curable by radiation (compare European Offenlegungsschrift No. 33,896). This compound, which has been found to be particularly suitable as an initiator in non-aqueous photopolymerizable systems and has significant advantages compared to other initiators, such as good ability to be incorporated in the photopolymerizable systems, good stability on storage in the dark and chemical stability and an increased photoinitiating effectiveness, has, however, disadvantages in the radiation curing of aqueous coating agents. Thus, it must be employed in relatively large amounts in aqueous systems, in particular for the curing of thin layers, and furthermore it has only inadequate reactivity in initiating radiation curing in these special prepolymer systems curable by radiation. This makes relatively long curing times necessary and leads to non-optimum utilization of industrial irradiation equipment.

SUMMARY OF THE INVENTION

Thus, it is an object of this invention to provide initiators for radiation curing of aqueous prepolymer dispersions, which are physiologically innocuous; can be easily incorporated in the aqueous systems; have as high a solubility and chemical stability as possible in the latter; have, mixed with the other reactants, an adequate stability on storage in the dark; which themselves, or which have secondary products which cause no yellowing of the reaction products; which cause a significantly lower surface adhesiveness on the coatings obtained with them; which at the same time have the greatest possible reactivity in their ability to initiate the curing of systems of this type which are curable by radiation; and which are effective even when used at only low concentrations.

Upon further study of the specification and appended claims, further objects and advantages of this invention will become apparent to those skilled in the art.

These objects have been attained by providing the hydroxyalkylphenones of formula I below as suitable initiators for the radiation curing of aqueous prepolymer dispersions. These compounds either do not have the disadvantages mentioned above or have them to a significantly smaller extent than the initiators hitherto used for the radiation curing of aqueous systems. In particular, they have good stability in aqueous systems and on removal of the water from these systems, and have a considerably increased reactivity in their ability to initiate the curing of aqueous systems curable by radiation.

Thus this invention relates to hydroxyalkylphenones of formula I

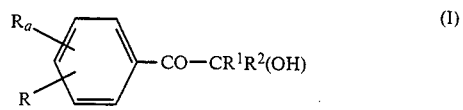

wherein

R is hydrogen, halogen, alkyl of 1 to 18 C atoms, alkoxy of 1 to 4 C atoms or

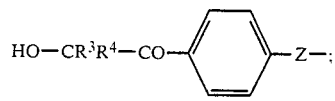

$R_a$ is hydrogen, halogen or alkyl of 1 to 4 C atoms.

$R^1$ and $R^2$ (a) are each independently alkyl of up to 14, together 4 to 16, C atoms or together are alkylene of 4 to 8 C atoms, when R is hydrogen, halogen, alkyl of 1 to 6 C atoms or alkoxy of 1 to 4 C atoms; or (b) are each independently alkyl of 1 to 6 C atoms or together are alkylene having 2 to 8 C atoms, when R is alkyl of 3 to 18 C atoms or

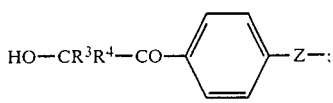

R³ and R⁴ are each independently alkyl of 1 to 6 C atoms or together are alkylene of 2 to 8 C atoms; and Z is —CO—, —CH₂—, —O—, or —S—, and their use as initiators for the photopolymerization of ethylenically unsaturated compounds. For use, the initiators are incorporated in aqueous prepolymer dispersions before photopolymerization.

This invention also relates to a process for the photopolymerization of ethylenically unsaturated compounds, wherein the initiators of formula I above are incorporated in aqueous prepolymer dispersions and, after removal of the water, the polymerization is initiated.

DETAILED DISCUSSION

The hydroxyalkylphenones of formula I, processes for their preparation and their use as initiators for photopolymerization of unsaturated compounds have already been disclosed in German Offenlegungsschrift No. 2,722,264, and its U.S. counterparts U.S. Pat. No. 4,347,111 and its continuation in part application Ser. No. 408,576 of Aug. 16, 1982; European Offenlegungsschrift No. 3,002 and its U.S. equivalents U.S. Pat. Nos. 4,308,400, 4,318,791, 4,321,118, and 4,315,807; and German Offenlegungsschrift No. 3,008,411, all of whose disclosures are incorporated by reference herein entirely. However, there are no indications in these texts that these compounds are particularly superior for the initiator of radiation curing of aqueous prepolymer dispersions. In particular, it is not possible to infer from these printed publications that, among the large number of compounds mentioned there, it is precisely the special hydroxyalkylphenones of formula I which have such particularly advantageous properties for use in aqueous systems.

In formula I, when R¹ and R² are each alkyl of up to 14, together 4 to 16, C atoms or together are alkylene of 4 to 8 C atoms, then R is hydrogen, halogen, unbranched or branched alkyl of 1 to 6 C atoms or alkoxy of 1 to 4 C atoms. R is preferably hydrogen, chlorine, methyl, ethyl, i-propyl, tert-butyl or methoxy. When R¹ and R² are each alkyl of 1 to 6 C atoms or together are alkylene of 2 to 8 C atoms, then R is unbranched or branched alkyl of 3 to 18 C atoms or

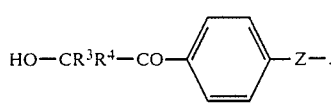

In this instance, R is preferably i-propyl, tert-butyl, hexyl, octyl, 2-ethylhexyl, decyl, dodecyl, tetradecyl, hexadecyl, octadecyl or the radical

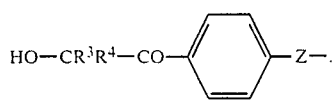

R is preferably located in the 4-position.

R_a is hydrogen, halogen or unbranched or branched alkyl of 1 to 4 C atoms, preferably hydrogen, chlorine or methyl. As a rule, the substituent is in the 2- or 3-position.

If R is hydrogen, halogen, alkyl of 1 to 6 C atoms or alkoxy of 1 to 4 C atoms, then R¹ and R² are each unbranched or branched alkyl of up to 14, together 4 to 16, C atoms or together are unbranched or branched alkylene having 4 to 8 C atoms. Unbranched alkyl radicals are preferred, for example, methyl, ethyl, propyl, butyl, pentyl, hexyl, octyl, decyl or dodecyl. The two alkyl radicals R¹ and R² preferably have together 6 to 10 C atoms. When R¹ and R² together are alkylene of 4 to 8 C atoms, then butylene, pentylene or hexylene is preferred.

If R is alkyl of 3 to 18 C atoms or

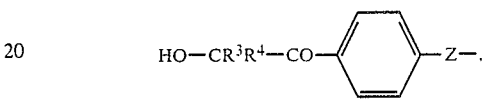

then R¹ and R² are each unbranched or branched alkyl of 1 to 6 C atoms or together are unbranched or branched alkylene of 2 to 8 C atoms. Unbranched alkyl radicals of 1 to 4 C atoms are preferred, such as methyl, ethyl, propyl or butyl, in particular methyl. The two radicals R¹ and R² are preferably identical. When R¹ and R² together are alkylene, they then form, together with the carbon atom to which they are bonded, preferably a cyclopropane, cyclobutane, cyclopentane, cyclohexane or cycloheptane ring.

In R, the alkoxy groups which are suitable include those having branched or unbranched alkyl portions, e.g., those mentioned above of 1 to 4 C atoms. In R and Ra, halo includes, F, Cl, Br and I.

R³ and R⁴ are each unbranched or branched alkyl of 1 to 6 C atoms or together are unbranched or branched alkylene of 2 to 8 C atoms. In this instance, the radicals mentioned as being preferred for R¹ and R² in the previous section are also preferred for R³ and R⁴. In particular, those compounds are preferred in which the group HO—CR³R⁴—CO— is identical to the group HO—CR¹R²—CO—.

Z is —CO—, —CH₂—, —O— or —S—; —CO— and —CH₂— are preferred.

Correspondingly, according to this invention, those compounds of formula I are particularly preferred in which at least one of the radicals R, Ra, R¹ to R⁴ and Z has one of the abovementioned preferred meanings. Examples of particularly preferred compounds of formula I usable according to this invention include the following:

1-phenyl-2-hydroxy-2,3-dimethyl-1-butanone
1-phenyl-2-hydroxy-2,3,3-trimethyl-1-butanone
1-phenyl-2-hydroxy-2-ethyl-3,3-dimethyl-1-butanone
1-phenyl-2-hydroxy-2-methyl-1-hexanone
1-phenyl-2-hydroxy-2-ethyl-1-hexanone
1-phenyl-2-hydroxy-2-methyl-1-heptanone
1-phenyl-2-hydroxy-2-ethyl-1-heptanone
1-phenyl-2-hydroxy-2-butyl-1-hexanone
1-phenyl-2-hydroxy-2-ethyl-1-decanone
1-benzoylcyclopropanol
1-benzoylcyclopentanol
1-benzoylcyclohexanol
1-benzoylcycloheptanol
1-(4'-chlorophenyl)-2-hydroxy-2-ethyl-1-hexanone 1-(4'-methylphenyl)-2-hydroxy-2-ethyl-1-hexanone
1-(3',4'-dimethylphenyl)-2-hydroxy-2-ethyl-1-hexanone
1-(4'-i-propylphenyl)-2-hydroxy-2-ethyl-1-hexanone
1-(4'-tert.-butylphenyl)-2-hydroxy-2-ethyl-1-hexanone
1-(4'-hexylphenyl)-2-hydroxy-2-methyl-1-propanone
1-(4'-octylphenyl)-2-hydroxy-2-methyl-1-propanone
1-(4'-decylphenyl)-2-hydroxy-2-methyl-1-propanone
1-(4'-dodecylphenyl)-2-hydroxy-2-methyl-1-propanone
1-(4'-hexadecylphenyl)-2-hydroxy-2-methyl-1-propanone
1-(4'-(2-ethylhexyl)-phenyl)-2-hydroxy-2-methyl-1-propanone
4,4'-bis(2-hydroxy-2-methylpropanoyl)benzophenone
4,4'-bis(2-hydroxy-2-ethylbutanoyl)benzophenone
4,4'-bis(1-hydroxycyclopentylcarbonyl)benzophenone
4,4'-bis(1-hydroxycyclohexylcarbonyl)benzophenone
4,4'-bis(2-hydroxy-2-methylpropanoyl)diphenylmethane
4,4'-bis(2-hydroxy-2-methylpropanoyl)diphenyl oxide, or
4,4'-bis(2-hydroxy-2-methylpropanoyl)diphenyl sulfide.

The preparation of the compounds of formula I has been disclosed in mentioned German Offenlegungsschrift No. 2,722,264, European Offenlegungsschrift No. 3,002 and German Offenlegungsschrift No. 3,008,411 and the U.S. counterparts thereof. The preparation processes mentioned in these texts as being preferred are preferably used.

The compounds of formula I are suitable, according to this invention, as initiators for radiation curing of aqueous prepolymer dispersions. This use takes place in a manner which is customary per se. As a rule, the hydroxyalkylphenones of formula I are added to the aqueous systems curable by radiation in amounts of 0.1 to 20% by weight, preferably 0.5 to 10% by weight, relative to the total weight of polymerizable moieties. This addition takes place, as a rule, by simple dissolution and stirring, since most of the systems to be cured and the initiators according to this invention are liquid or at least readily soluble. However, it is also possible to incorporate the initiator even during the preparation of the aqueous prepolymer dispersion curable by radiation.

Suitable aqueous prepolymer dispersions curable by radiation, many variations of which are commercially available, are understood to include dispersions of water and at least one prepolymer dispersed therein and optionally other known and customary auxiliaries and additives. As a rule, in these systems, the water is present at a concentration of 5 to 80, preferably 30 to 60, % by weight. Accordingly, the prepolymer, or mixture of prepolymers, curable by radiation is contained therein in amounts of 95 to 20, preferably 70 to 40, % by weight. The total of the percentages mentioned for water and prepolymers is always 100, it being possible for auxiliaries and additives to be added over and above these amounts, in amounts differing according to the intended use, but fully conventional.

The film-forming prepolymers curable by radiation, which are dispersed, and frequently also dissolved, in water, (e.g., in general, aqueous mixtures are involved), are monofunctional or polyfunctional ethylenically unsaturated prepolymers, which can be initiated by free radicals and are known per se for aqueous prepolymer dispersions. In this context, the special intended uses are also of importance. As a rule, these prepolymers have a content of 0.01 to 1.0 mol of polymerizable C-C double bonds per 100 g of prepolymer and a mean molecular weight of at least 400, as a rule of 500 to 10,000. However, for special intended uses, prepolymers having higher molecular weights are also suitable.

Suitable examples include polyesters containing polymerizable C-C double bonds and having a maximum acid value of 10, polyethers containing polymerizable C-C double bonds, products containing hydroxyl groups from the reaction of a polyepoxide, which contains at least two epoxide groups per molecule, with at least one α,β-ethylenically unsaturated carboxylic acid, polyurethane(meth)acrylates and acrylic copolymers containing α,β-ethylenically unsaturated acyl radicals, as are described in European Offenlegungsschrift No. 12,339. Likewise, mixtures of these prepolymers are also suitable. In addition, the polymerizable prepolymers described in European Offenlegungsschrift No. 33,896, which are thioether adducts of polymerizable prepolymers having a mean molecular weight of at least 600, a carboxyl group content of 0.2 to 15% and a content of 0.01 to 0.8 mol of polymerizable C-C double bonds per 100 g of prepolymer, are suitable. Moreover, aqueous dispersions based on special alkyl(meth)acrylate polymers having two pronounced maxima, which virtually do not overlap, in the particle size distribution, e.g., as described in European Offenlegungsschrift No. 41,125, are suitable. Furthermore, prepolymers of urethane acrylates, which are dispersible in water and curable by radiation, and described in German Offenlegungsschrift No. 2,936,039, are suitable.

These aqueous prepolymer dispersions curable by radiation can contain, as further conventional additives, dispersing auxiliaries, emulsifiers, and also antioxidants, photostabilizers, dyestuffs, pigments, reaction accelerators, fillers and other auxiliaries customary on paint technology. Suitable dispersing auxiliaries are water-soluble high molecular weight organic compounds having polar groups, such as, for example, polyvinyl alcohols, polyvinylpyrrolidone and cellulose ethers. Emulsifiers which can be used are non-ionic but optionally also ionic emulsifiers. Depending on the intended use, the pigments and/or fillers customary in paint technology, such as talc, gypsum, silica, rutile, carbon black, zinc oxide, iron oxides or organic pigments, and also auxiliaries, such as flow-control agents, lubricants, wetting agents, thickening agents, delustrants and defoamers, can be added to the aqueous prepolymer dispersions curable by radiation.

The preparation of aqueous prepolymer dispersions or mixtures of this type which are curable by radiation has been disclosed and, in particular, the processes mentioned in the literature and in the printed publications cited above are used.

The hydroxyalkylphenones of formula I can be employed as initiators for radiation curing of coating agents for non-metallic and metallic substrates, for example for paper, wood, leather, plastics, glass, ceramics and metallic bases. In this context, porous substrates are preferred, such as, for example, paper, wood and leather. Furthermore, the compounds of formula I can be employed as initiators for the radiation curing of those aqueous prepolymer dispersions which are absorbed in non-woven fabrics in order to strengthen them.

The aqueous systems of this invention are radiation cured after complete evaporation of the water or, in the case, of spray application, after additional complete escape of the trapped air by methods known per se. In general, the water is removed by brief preheating at temperatures up to 100° or by brief IR irradiation. Only very short preheating times are necessary for most porous substrates, since the major amount of the water is taken up by the base; it is frequently also possible entirely to omit preheating. The subsequent photopolymerization is carried out by irradiation with light or UV radiation in the wavelength range from about 250 to 500 nm, preferably from 300 to 400 nm. Sunlight or artificial radiation emitters can be used as the sources of radiation. Advantageous examples include high pressure, medium pressure or low pressure mercury vapor lamps and xenon and tungsten lamps; laser light sources can also be employed.

Without further elaboration, it is believed that one skilled in the art can, using the preceding description, utilize the present invention to its fullest extent. The following preferred specific embodiments are, therefore, to be construed as merely illustrative, and not limitative in any way whatsoever. In the following examples, all temperatures are set forth uncorrected in degrees Celsius; unless otherwise indicated, all parts and percentages are by weight.

In the following examples, the use according to this invention of hydroxyalkylphenones of formula I as initiators for radiation curing of aqueous prepolymer dispersions is described in more detail.

EXAMPLE 1

20 g of a delustrant based on silica (delustrant OK 412 supplied by Degussa, Frankfurt/M.) is dispersed in 166 g of a 50% aqueous emulsion of an unsaturated acrylate resin (Laromer ®LR 8576 supplied by BASF AG, Ludwigshafen). After standing for a period of 18 hours, a further 166 g of the 50% aqueous emulsion of the unsaturated acrylate resin and 35.2 g of water are added with stirring. 1.2% of the appropriate initiator is stirred into each 150 g of this homogeneous aqueous dispersion. These dispersions are stored in brown colored glass bottles. After standing for a period of 24 hours, the aqueous dispersions to which the particular initiator has been added are applied to glass plates in layer thicknesses of 250 μm using a film applicator. The coated glass plates are dried at 100° for 20 minutes. The subsequent curing of these anhydrous coatings is carried out with a Minicure device (supplied by Primarc Ltd. (England)), in which the coated glass plates are conveyed on a conveyor belt with a variable speed under a medium pressure Hg lamp (radiant intensity 80 W/cm) with 10 cm spacings and are thereby irradiated. The dose of radiation is varied by changing the speed of the belt.

In the following Table 1, the maximum speeds of the belt (in m/min) are reported at which the particular coating is still cured to such an extent that its surface is dry and non-adhesive. The lack of adhesion is determined using a small degreased piece of cotton wool by the method given in German Auslegeschrift No. 2,713,797. The same degree of curing of a system cured with UV radiation is obtained, under conditions which are otherwise identical, in an irradiation time which is shorter, the more suitable is the initiator used.

TABLE 1

| Photoinitiator used | Speed of belt (m/min) |
| --- | --- |
| 1-(4-dodecylphenyl)-2-hydroxy-2-methyl-1-propanone | 250 |
| 1-phenyl-2-hydroxy-2-methyl-1-propanone (comparison) | 50 |

TABLE 1-continued

| Photoinitiator used | Speed of belt (m/min) |
| --- | --- |

The results show that, using the initiator according to this invention, significantly higher speeds of the belt can be used, i.e., a thoroughly cured coating with a non-adhesive surface can be obtained in a significantly shorter time.

EXAMPLE 2

300 g of water is added, with stirring, to 300 g of a 50% aqueous emulsion of an unsaturated acrylate resin (Laromer ®LR 8576 supplied by BASF AG, Ludwigshafen). The mixture is then stirred a further 30 minutes. 1.275 g of the initiator and 1.275 g of a 10% aqueous solution of a wetting agent based on a fluorinated alkyl ester (Fluorad ®FC 430 supplied by 3M-Deutschland GmbH, Neuss) are each stirred into each 170 g of this aqueous dispersion obtained.

The aqueous dispersions to which the particular initiator has been added are applied to glass plates in layer thicknesses of 120 μm using a film applicator. The coated glass plates are dried at 100° for 10 minutes. The subsequent curing of these anhydrous coatings is carried out with a Minicure device (supplied by Primarc Ltd. (England)) in which the coated glass plates are conveyed on a conveyor belt with a variable speed underneath medium pressure Hg lamps (total radiant intensity of the lamps 120 W/cm) at 10 cm spacing and are thereby irradiated. The dose of radiation is varied by changing the speed of the belt.

In the following Table 2, the maximum speeds of the belt (in m/min) are reported at which the particular coating is still cured to such an extent that its surface is dry and non-adhesive. The lack of adhesion is determined as stated in Example 1.

TABLE 2

| Photoinitiator used | Speed of belt (m/min) |
| --- | --- |
| 1-(4'-methylphenyl)-2-hydroxy-2-ethyl-1-hexanone | 280 |
| 1-phenyl-2-hydroxy-2-methyl-1-propanone (comparison) | 60 |

These results again show that, on using an initiator according to this invention, significantly higher speeds of the belt can be used, i.e., a thoroughly cured coating with a non-adhesive surface can be obtained in a significantly shorter time.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. An aqueous photopolymerizable composition comprising an effective amount of (A) an hydroxyalkylphenone photoinitiator of the formula

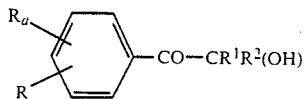

wherein

R is hydrogen, halogen, alkyl of 1 to 18 C atoms, alkoxy of 1 to 4 C atoms or

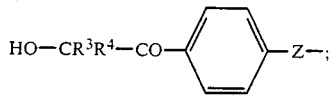

$R_a$ is hydrogen, halogen or alkyl of 1 to 4 C atoms;
$R^1$ and $R^2$ (a) are each alkyl of up to 14 C-atoms and together have 4 to 16 C atoms or together are alkylene of 4 to 8 C atoms, when R is hydrogen, halogen, alkyl of 1 to 6 C atoms or alkoxy of 1 to 4 C atoms, or (b) are each alkyl of 1 to 6 C atoms or together are alkylene of 2 to 8 C atoms, when R is alkyl of 3 to 18 C atoms or

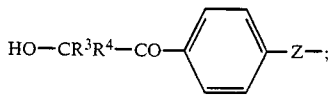

$R^3$ and $R^4$ are each alkyl of 1 to 6 C atoms or together are alkylene of 2 to 8 C atoms; and
Z is —CO—, —CH$_2$—, —O—, or —S—,
(B) 95–20 wt. % of a photopolymerizable ethylenically unsaturated prepolymer, and
(C) 5–80 wt % of water,
the amounts of (B) and (C) being relative to the total of B and C which is 100%.

2. A composition of claim 1 wherein R is H, Cl, methyl, ethyl, i-propyl, t-butyl or methoxy, and $R^1$ and $R^2$ each are unbranched alkyl, the total number of C atoms in both alkyl groups being 6–10, or together are unbranched C$_{4-6}$-alkylene.

3. A composition of claim 1 wherein R is i-propyl, t-butyl, hexyl, octyl, 2-ethylhexyl, decyl, dodecyl, tetradecyl, hexadecyl, octadecyl or

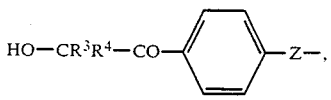

and $R^1$ and $R^2$ are unbranched alkyl of 1–4 C atoms or together are unbranched C$_{3-7}$-alkylene.

4. A composition of claim 1 wherein HO—CR$^3$R$^4$—CO— is identical to HO—CR$^1$R$^2$—CO—.

5. A composition of claim 1 wherein Z is —CO— or —CH$_2$—.

6. A composition of claim 1 wherein the hydroxyalkylphenone photoinitiator is
1-phenyl-2-hydroxy-2,3-dimethyl-1-butanone
1-phenyl-2-hydroxy-2,3,3-trimethyl-1-butanone
1-phenyl-2-hydroxy-2-ethyl-3,3-dimethyl-1-butanone
1-phenyl-2-hydroxy-2-methyl-1-hexanone
1-phenyl-2-hydroxy-2-ethyl-1-hexanone
1-phenyl-2-hydroxy-2-methyl-1-heptanone
1-phenyl-2-hydroxy-2-ethyl-1-heptanone
1-phenyl-2-hydroxy-2-butyl-1-hexanone
1-phenyl-2-hydroxy-2-ethyl-1-decanone
1-benzoylcyclopropanol
1-benzoylcyclopentanol
1-benzoylcyclohexanol
1-benzoylcycloheptanol
1-(4′-chlorophenyl)-2-hydroxy-2-ethyl-1-hexanone
1-(4′-methylphenyl)-2-hydroxy-2-ethyl-1-hexanone
1-(3′,4′-dimethylphenyl)-2-hydroxy-2-ethyl-1-hexanone
1-(4′-i-propylphenyl)-2-hydroxy-2-ethyl-1-hexanone
1-(4′-tert.-butylphenyl)-2-hydroxy-2-ethyl-1-hexanone
1-(4′-hexylphenyl)-2-hydroxy-2-methyl-1-propanone
1-(4′-octylphenyl)-2-hydroxy-2-methyl-1-propanone
1-(4′-decylphenyl)-2-hydroxy-2-methyl-1-propanone
1-(4′-dodecylphenyl)-2-hydroxy-2-methyl-1-propanone
1-(4′-hexadecylphenyl)-2-hydroxy-2-methyl-1-propanone
1-(4′-(2-ethylhexyl)-phenyl)-2-hydroxy-2-methyl-1-propanone
4,4′-bis(2-hydroxy-2-methylpropanoyl)benzophenone
4,4′-bis(2-hydroxy-2-ethylbutanoyl)benzophenone
4,4′-bis(1-hydroxycyclopentylcarbonyl)benzophenone
4,4′-bis(1-hydroxycyclohexylcarbonyl)benzophenone
4,4′-bis(2-hydroxy-2-methylpropanoyl)diphenylmethane
4,4′-bis(2-hydroxy-2-methylpropanoyl)diphenyl oxide, or
4,4′-bis(2-hydroxy-2-methylpropanoyl)diphenyl sulfide.

7. A composition of claim 1 wherein the amount of hydroxyalkylphenone initiator is 0.1–20 wt. % relative to the weight of component (B).

8. A composition of claim 1 wherein component (B) is dispersed in the water.

9. A method for photopolymerizing a photopolymerizable composition of claim 1 comprising removing the water from the composition and irradiating the resultant composition with effective radiation, effective to polymerize component (B).

10. A method of claim 9 wherein, prior to removing water from said composition, the latter is applied to a substrate on which it is desired to form a coating of the polymerized prepolymer (B).

11. A method of claim 9 wherein, in said composition, R is H, Cl, methyl, ethyl, i-propyl, t-butyl or methoxy, and $R^1$ and $R^2$ each are unbranched alkyl, the total number of C atoms in both alkyl groups being 6–10, or together are unbranched C$_{4-6}$-alkylene.

12. A method of claim 9 wherein, in said composition, R is i-propyl, t-butyl, hexyl, octyl, 2-ethylhexyl, decyl, dodecyl, tetradecyl, hexadecyl, octadecyl or

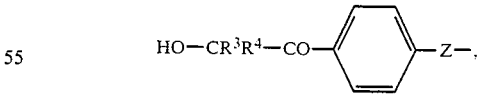

and $R^1$ and $R^2$ are unbranched alkyl of 1–4 C atoms or together are unbranched C$_{3-7}$-alkylene.

13. A method of claim 9 wherein HO—CR$^3$R$^4$—CO— is identical to HO—CR$^1$R$^2$—CO—.

14. A method of claim 9 wherein Z is —CO— or —CH$_2$—.

15. A method of claim 9 wherein the hydroxyalkylphenone photoinitiator is
1-phenyl-2-hydroxy-2,3-dimethyl-1-butanone
1-phenyl-2-hydroxy-2,3,3-trimethyl-1-butanone
1-phenyl-2-hydroxy-2-ethyl-3,3-dimethyl-1-butanone 1-phenyl-2-hydroxy-2-methyl-1-hexanone
1-phenyl-2-hydroxy-2-ethyl-1-hexanone
1-phenyl-2-hydroxy-2-methyl-1-heptanone
1-phenyl-2-hydroxy-2-ethyl-1-heptanone
1-phenyl-2-hydroxy-2-butyl-1-hexanone
1-phenyl-2-hydroxy-2-ethyl-1-decanone
1-benzoylcyclopropanol
1-benzoylcyclopentanol
1-benzoylcyclohexanol
1-benzoylcycloheptanol
1-(4'-chlorophenyl)-2-hydroxy-2-ethyl-1-hexanone
1-(4'-methylphenyl)-2-hydroxy-2-ethyl-1-hexanone
1-(3',4'-dimethylphenyl)-2-hydroxy-2-ethyl-1-hexanone
1-(4'-i-propylphenyl)-2-hydroxy-2-ethyl-1-hexanone
1-(4'-tert.-butylphenyl)-2-hydroxy-2-ethyl-1-hexanone
1-(4'-hexylphenyl)-2-hydroxy-2-methyl-1-propanone
1-(4'-octylphenyl)-2-hydroxy-2-methyl-1-propanone
1-(4'-decylphenyl)-2-hydroxy-2-methyl-1-propanone
1-(4'-dodecylphenyl)-2-hydroxy-2-methyl-1-propanone
1-(4'-hexadecylphenyl)-2-hydroxy-2-methyl-1-propanone
1-(4'-(2-ethylhexyl)-phenyl)-2-hydroxy-2-methyl-1-propanone
4,4'-bis(2-hydroxy-2-methylpropanoyl)benzophenone
4,4'-bis(2-hydroxy-2-ethylbutanoyl)benzophenone
4,4'-bis(1-hydroxycyclopentylcarbonyl)benzophenone
4,4'-bis(1-hydroxycyclohexylcarbonyl)benzophenone
4,4'-bis(2-hydroxy-2-methylpropanoyl)diphenylmethane
4,4'-bis(2-hydroxy-2-methylpropanoyl)diphenyl oxide, or
4,4'-bis(2-hydroxy-2-methylpropanoyl)diphenyl sulfide.

16. A method of claim 9 wherein the amount of hydroxyalkylphenone initiator is 0.1-20 wt. % relative to the weight of component (B).

17. A method of claim 9 wherein component (B) is dispersed in the water.

18. A composition of claim 1 wherein R is hydrogen, halogen, alkyl or alkoxy and $R^1$ and $R^2$ together are alkylene.

19. A composition of claim 1 wherein R is

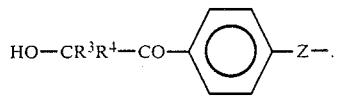

20. A composition of claim 1 wherein R or Ra is halogen or alkoxy.

* * * * *